United States Patent
Pas

(10) Patent No.: US 7,824,824 B2
(45) Date of Patent: Nov. 2, 2010

(54) COMPOSITE PHASE SHIFTING LITHOGRAPHY MASK INCLUDING ETCH STOP LAYER

(75) Inventor: Sylvia Pas, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1062 days.

(21) Appl. No.: 11/074,509

(22) Filed: Mar. 8, 2005

(65) Prior Publication Data

US 2006/0204860 A1 Sep. 14, 2006

(51) Int. Cl.
*G03F 1/00* (2006.01)

(52) U.S. Cl. .............................. 430/5; 430/311; 430/394

(58) Field of Classification Search ............... 430/5, 430/311
See application file for complete search history.

(56) References Cited

U.S. PATENT DOCUMENTS

| | | | |
|---|---|---|---|
| 5,173,392 A * | 12/1992 | Miersch et al. | 430/311 |
| 6,319,639 B1 * | 11/2001 | Reinberg | 430/5 |
| 6,511,777 B1 | 1/2003 | Pas | |
| 2003/0194568 A1 * | 10/2003 | Angelopoulos et al. | 428/432 |
| 2004/0081896 A1 * | 4/2004 | Pierrat | 430/5 |
| 2004/0124174 A1 * | 7/2004 | Yan et al. | 216/54 |
| 2005/0026053 A1 * | 2/2005 | Martin et al. | 430/5 |
| 2005/0084768 A1 * | 4/2005 | Han et al. | 430/5 |

OTHER PUBLICATIONS

Jhaveri, Tejas, et al., "AAPSM space-imbalance reduction for 65nm lithography," *Solid State Technology*, Internet article, 5 pages.

* cited by examiner

*Primary Examiner*—Stephen Rosasco
*Assistant Examiner*—Rashid Alam
(74) *Attorney, Agent, or Firm*—Warren L. Franz; Wade J. Brady, III; Frederick J. Telecky, Jr.

(57) ABSTRACT

The formation of a lithographic mask (100) is disclosed, where the mask (100) can be used in forming integrated circuits onto a semiconductor substrate. A layer of etch stop material (106) is sandwiched between first (102) and second (108) layers of transmissive material that are substantially transparent to lithographic light. The layer of etch stop material (106) serves as an etch stop when a circuit pattern is etched into the second layer of transmissive material (108). This allows the second layer of etch stop material (108) to be etched to a more precise depth thereby providing a desired phase shift and concurrently controlling critical dimension width.

13 Claims, 2 Drawing Sheets

COMPOSITE PHASE SHIFTING LITHOGRAPHY MASK INCLUDING ETCH STOP LAYER

FIELD OF INVENTION

The present invention relates generally to semiconductor fabrication, and more particularly to forming a lithography mask that can be used in patterning a semiconductor substrate.

BACKGROUND OF THE INVENTION

It can be appreciated that several trends presently exist in the electronics industry. Devices are continually getting smaller, faster and requiring less power, while simultaneously being able to support and perform a greater number of increasingly complex and sophisticated functions. One reason for these trends is an ever increasing demand for small, portable and multifunctional electronic devices. For example, cellular phones, personal computing devices, and personal sound systems are devices which are in great demand in the consumer market. These devices rely on one or more small batteries as a power source while providing increased computational speed and storage capacity to store and process data, such as digital audio, digital video, contact information, database data and the like.

Accordingly, there is a continuing trend in the semiconductor industry to manufacture integrated circuits (ICs) with higher device densities. To achieve such high densities, there have been and continue[[s]] to be efforts toward scaling down dimensions (e.g., at submicron levels) on semiconductor wafers. To accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yield in IC fabrication processes by providing more circuits on a semiconductor die and/or more die per semiconductor wafer, for example.

One technique used in forming integrated circuits on semiconductor substrates is lithography, which broadly refers to processes for transferring one or more patterns between various media. In lithography, a light sensitive resist coating is formed over one or more layers to which a pattern is to be transferred (e.g., a semiconductor substrate). The resist is then patterned by exposing it to light, where the light (selectively) passes through an intervening lithography mask containing the pattern. The light causes the exposed or unexposed portions of the resist coating to become more or less soluble, depending on the type of resist used. A developer is then used to remove the more soluble areas leaving the patterned resist. The patterned resist can then serve as a mask for the underlying layers which can be selectively treated (e.g., etched) to transfer the pattern thereto.

In some types of lithography masks, such as phase shift masks, for example, the thickness of the masks is adjusted at select locations, such as via etching, for example, to produce desired behavior. In phase shift masks, for example, the thickness of the masks is adjusted at select locations to cause the phase of light passing through to be shifted by varying amounts (e.g., by diffraction). This creates positive and negative interference at desired locations to produce sharper, more defined features, edges, etc. In this manner, phase shifting can enhance the resolution of pattern transfers.

It can thus be appreciated that the accuracy with which integrated circuit patterns are formed on semiconductor substrates is, in large part, a function of the lithography mask used in transferring the patterns. The higher quality the lithography mask, the better the pattern transfers will be. Accordingly, it would be desirable to accurately and precisely produce a lithography mask which can be used to transfer patterns of reduced dimensions onto a semiconductor substrate to facilitate device scaling.

A lithography mask is generally constructed by depositing a substantially opaque layer of material on a surface of a transmissive substrate, where the substrate is substantially transparent to the light used to effect lithographic pattern transfers. Portions of the opaque layer are removed to form the pattern to be transferred to the wafer. With regard to phase shift masks, for example, a thickness of the substrate is reduced at various locations to yield desired phase shifts. Reducing the thickness of the light transmitting substrate may be accomplished by etching or other suitable processes. For example, the substrate may be etched at select locations until a desired thickness remains to yield desired phase shifting.

However, conventional methods for fabricating lithography masks have several drawbacks. For example, aside from the duration of an etching process and/or the chemistry of a homogeneous blanket film of the etching process, the precision of resulting parameters from lithography mask fabrication etch processes is difficult to control. This can, for example, result in imprecise thicknesses of the light transmitting substrate. As a result, an actual phase shift can vary from a desired phase shift due to a deviation between an obtained lithography mask substrate thickness and a desired lithography mask substrate thickness. Further, dry etching techniques are generally isotropic—meaning that they remove equal amounts of material in both horizontal and vertical directions. This makes it difficult to form a deep yet narrow feature in a lithography mask, as may be desired to advance device scaling. In addition, the width of such a feature becomes proportional to the depth required to achieve a certain phase shift. This reduces the ability to control critical dimensions independently of phase shift.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming a lithography mask in a manner that allows select locations of the mask to be reduced in thickness by a specific amount. More particularly, a sandwich layer of etch stop material is included within the mask to halt the progression of an etching process so that an appropriate phase shift may be achieved by varying the etch depth into substrate material.

According to one or more aspects of the present invention, a method of forming a lithography mask is disclosed. The method includes forming a layer of etch stop material over a first layer of transmissive material. A second layer of transmissive material is then formed over the layer of etch stop material. A layer of opaque material is then formed over the second layer of transmissive material. Finally, a pattern that is in the layer of opaque material is etched into the second layer of transmissive material with the layer of etch stop material serving as an etch stop.

According to one or more other aspects of the present invention, a lithographic mask is disclosed. The mask includes a layer of etch stop material formed over a first layer of transmissive material. The mask also has a second layer of transmissive material formed over the layer of etch stop material. Additionally, a layer of opaque material is formed over the second layer of transmissive material, where a pattern formed in the layer of opaque material is also formed into the second layer of transmissive material.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
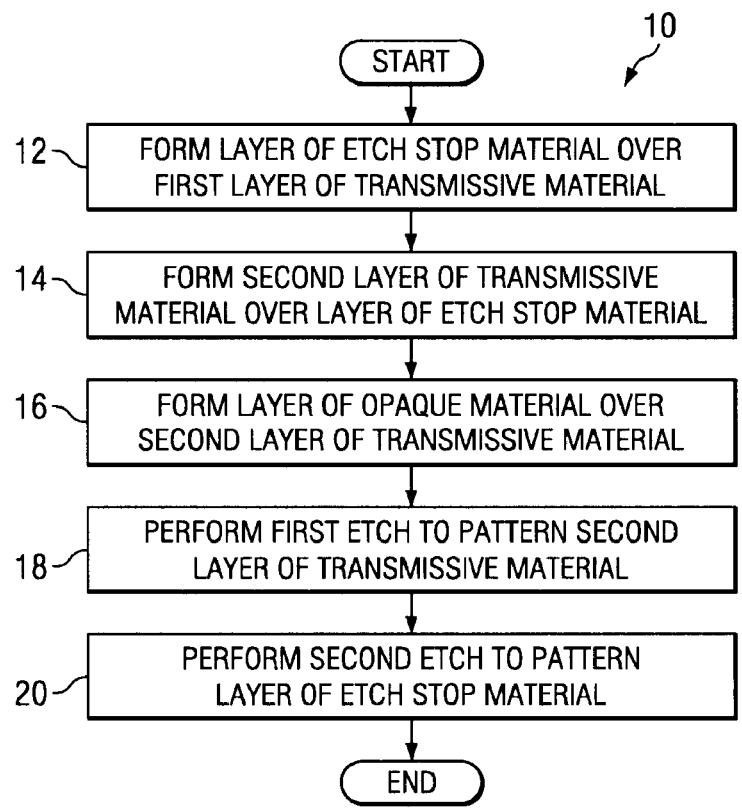
FIG. 1 is a flow diagram illustrating an exemplary methodology for forming a lithography mask in accordance with one or more aspects of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Turning to FIG. 1, an exemplary methodology 10 is illustrated for forming a lithography mask 100 according to one or more aspects of the present invention. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 2:
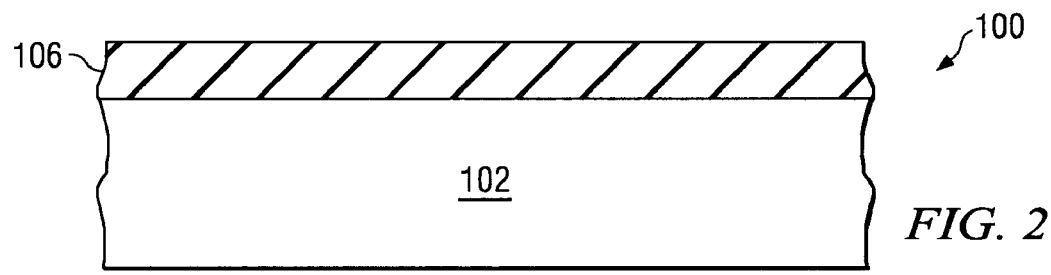
FIGS. 2-6 are cross-sectional illustrations of an exemplary lithography mask formed according to one or more aspects of the present invention, such as the methodology set forth in FIG. 1.

The methodology 10 begins at 12 wherein a layer of etch stop material 106 is formed over a first layer of transmissive material 102 (FIG. 2). The first layer of transmissive material 102 is substantially transparent to the light used in lithographic processing. More particularly, the first layer of transmissive material 102 is substantially transparent to the light that is to pass through the lithography mask 100 and impinge upon select areas of a resist to make those areas of the resist more or less soluble, depending upon the type of resist used. This allows the resist to be patterned, which in turn allows the pattern to be transferred to one or more underlying layers, such as a semiconductor substrate, for example.

Figure 3:
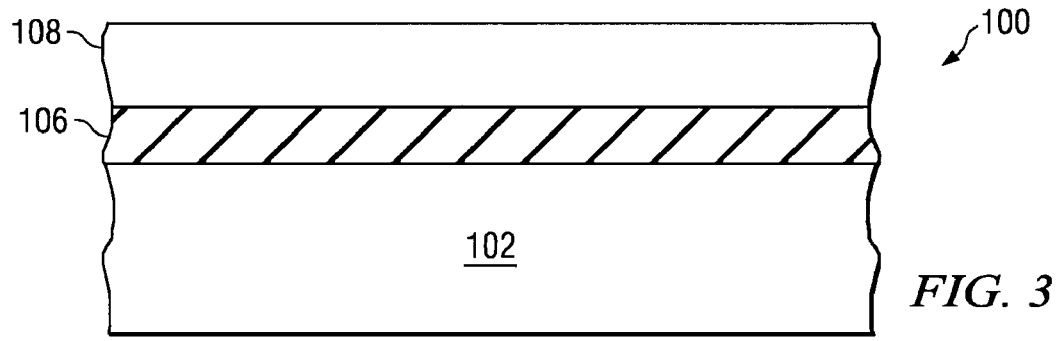
Figure 4:
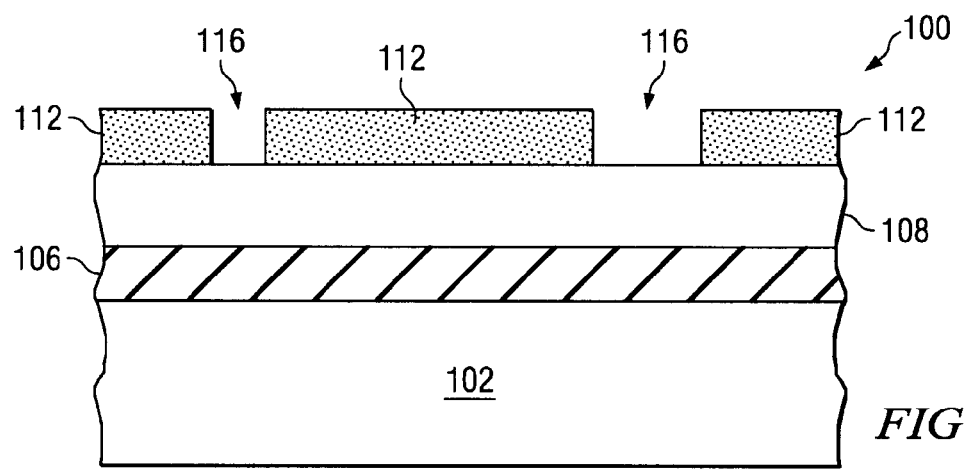

At 14, a second layer of transmissive material 108 is formed over the layer of etch stop material 106 (FIG. 3). As with layer 102, the second layer of transmissive material 108 is substantially transparent to lithographic light. A layer of opaque material 112 is then formed over the second layer of transmissive material 108 at 16 (FIG. 4). The layer of opaque material 112 blocks lithographic light, but is patterned to contain one or more etched features 116 or other features (not shown) corresponding to the integrated circuit pattern to be transferred to a resist and subsequently onto one or more other layers, such as a semiconductor wafer, for example. In one example, the layer of opaque material 108 comprises chrome or molybdenum silicide while the first and second layers of transmissive material 102, 108 comprise quartz and/or glass.

Figure 5:
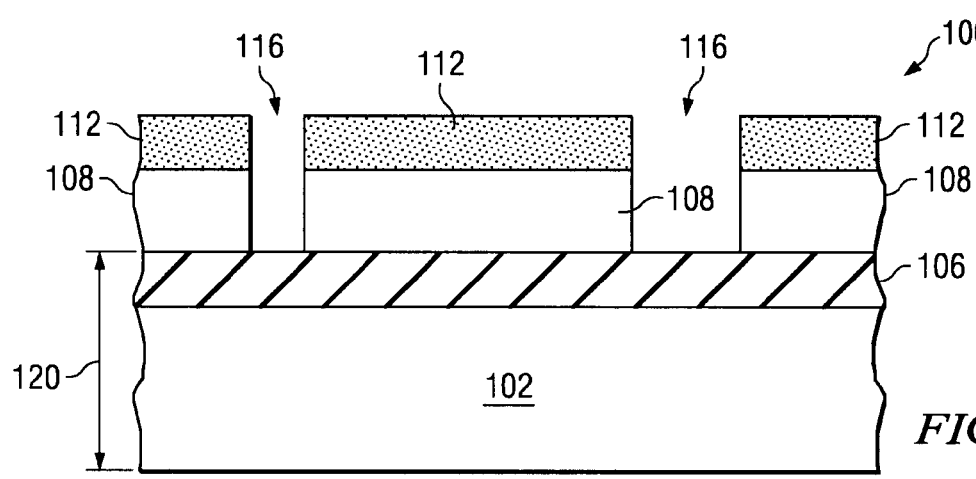
Figure 6:
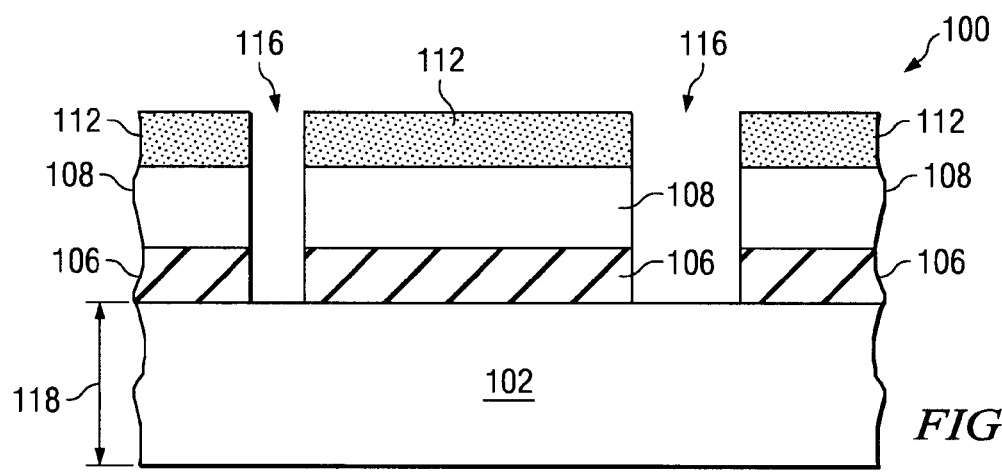

At 18, the second layer of transmissive material 108 is patterned so that the-features 116 are formed down into this layer 108 (FIG. 5). In this manner, the pattern to be instilled into a resist is formed within the mask 100. At 20, the layer of etch stop material 106 is similarly patterned so that the vias 116 (or other features) are formed down into this layer 106 as well such that the mask has a desired thickness 118 at these locations 116 (FIG. 6). It will be appreciated, however, that etching the layer of etch stop material 106 is optional since the layer of etch stop material 106, like the first and second layers of transmissive material 102, 108, is preferably substantially transparent to lithographic light. As such, the light will still be able to pass through the mask 100 at the select locations 116 regardless of whether or not the layer of etch stop material 106 has been etched at these locations. With regard to phase shifts masks, for example, the layer of etch stop material 106 and the first layer of transmissive material 102 would be formed to particular thicknesses so that the combined thicknesses of these layers 102, 106 would provide the mask with a desired thickness 120 at these locations so that the intended phase shifting is produced (FIG. 5).

By way of example only and not limitation, the layer of etch stop material 106 may comprise any one or more of Si, $SiO_x$, $Si_xN_y$, Al, $Ta_xN_y$, and/or W, either alone or in combination, and may be formed to a thickness of less than 10,000 Angstroms, for example, but is preferably formed to a thickness of between about 0 Angstroms and about 5,000 Angstroms. In any event, the layer of etch stop material 106 has an etch selectivity different from that of the second layer of transmissive material 108, and preferably different from that of the first layer of transmissive material 102 as well. By way of example, the second 108 (and first 102) layer of transmissive material may be etched more aggressively with fluorine (F) containing (e.g., $SF_6$) and/or methane ($CH_4$) type chemistries, particularly in the case of primarily oxygen and nitrogen containing material, and more particularly where certain operating parameters are selectively controlled, such as ratio, power, plasma, partial and total pressure, etc. Similarly, the layer of etch stop material 106 may be more aggressively etched with chlorine (Cl) type chemistries (e.g., BCl$_3$), particularly in the case of primarily metal composed material.

The different etch selectivity between the second layer of transmissive material 108 and the layer of etch stop material 106 allows the second layer of transmissive material 108 to be etched to a precise depth, namely down to the etch stop material 106. Accordingly, with regard to phase shift masks, for example, the depth and width of the patterned feature at the select locations 116 can be set very precisely by etching away the second layer of transmissive material 108 at these locations. The etching stops on the layer of etch stop material 106 so that there is little concern of overetching and creating a feature with the incorrect phase shift or with a critical dimension larger than desired at these locations. This provides more control and predictability over a critical dimension target and over the phase shifting of light that will pass through the mask 100 at these locations 116. Similarly, should the layer of etch stop material 106 be patterned as well, the different etch selectivity between the layer of etch stop material 106 and the first layer of transmissive material 102 will provide more predictable results, rather than just "timing" the duration of the etching process and/or using a particular etch chemistry in hopes of obtaining a desired phase shift or critical dimension.

Additionally, according to one or more aspects of the present invention, the second layer of transmissive material 108 and/or the layer of etch stop material 106 can be patterned with wet and/or dry etching techniques, as well as with any other suitable techniques. Drawbacks conventionally associated with these techniques, such as isotropic etching and/or unwanted undercuts, are mitigated by the different etch selectivities between the first and second layers of transmissive material 102, 108 and the layer of etch stop material 106, as well as between the layer of opaque material 112 and the second layer of transmissive material 108 and the layer of etch stop material 106, where the patterned layer of opaque material 112 serves as a mask for patterning these layers 108, 106. Further, so that the layer of etch stop material 106 does not significantly alter the behavior of the mask 100, this layer 106 is preferably substantially uniform with regard to its transmissive properties and also has a thermal coefficient of expansion similar to that of quartz or other materials out of which the first 102 and second 108 layers of transmissive material are fashioned. As such, the layer of etch stop material 106 behaves in a manner similar to that of the first and second layers of transmissive material 102, 108.

Accordingly, forming a lithography mask according to one or more aspects of the present invention facilitates device scaling by allowing the mask to be made more accurately, which in turn allows the fidelity and/or registration of pattern transfers effected with the mask to be improved. Further, the heretofore dependence between etch depth and feature width (critical dimension) is broken or untied so that etching can be performed to achieve a desired thickness for phase shifting while concurrently retaining (independent) control over feature width.

It will be appreciated that while reference is made throughout this document to exemplary structures in discussing aspects of methodologies described herein (e.g., those structures presented in FIGS. 2-6 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the drawings.

It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example. Further, the term "exemplary" as used herein merely meant to mean an example, rather than the best.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a phase shifting lithography mask, comprising:

providing a substrate which is substantially transparent to light of given wavelength used to effect lithographic pattern transfers; the substrate including a layer of etch stop material over a first layer of light transmissive material comprising at least one of quartz or glass; and a second layer of light transmissive material comprising at least one of quartz or glass over the layer of etch stop material; the layer of etch stop material and the second layer of light transmissive material having different etch selectivity;

providing a patterned layer of opaque material over the second layer of light transmissive material; and selectively etching the second layer of light transmissive material through the patterned layer down to the layer of etch stop material;

wherein the first layer of light transmissive material, the layer of etch stop material and the second layer of light transmissive material have thicknesses such that light of the given wavelength directed from a light source through etched portions of the substrate to pattern a photosensitive surface will be shifted in phase by a given amount relative to light of the given wavelength transmitted through unetched portions of the substrate.

2. The method of claim 1, wherein the second layer of light transmissive material is etched with an etch chemistry comprising at least one of fluorine or methane.

3. The method of claim 2, further comprising selectively etching the layer of etch stop material through the patterned layer and through the etched second layer of light transmissive material down to the first layer of light transmissive material.

4. The method of claim 3, wherein the layer of etch stop material is etched with an etch chemistry comprising chlorine.

5. The method of claim 4, wherein the layer of etch stop material is formed to a thickness of less than 10,000 Angstroms.

6. The method of claim 5, wherein the pattern formed in the layer of opaque material and transferred to the second layer of transmissive material and the layer of etch stop material corresponds to an integrated circuit layout.

7. The method of claim 1, wherein the layer of etch stop material is substantially uniform with regard to its light transmissive properties, and has a thermal coefficient of expansion similar to that of the first and second layers of light transmissive material.

8. A method of forming a phase shifting lithography mask, comprising:
   providing a substrate which is substantially transparent to light of given wavelength used to effect lithographic pattern transfers; the substrate including a layer of etch stop material over a first layer of light transmissive material comprising at least one of quartz or glass; and a second layer of the light transmissive material comprising at least one of quartz or glass over the layer of etch stop material; the etch stop material and the light transmissive material having different etch selectivity;
   providing a patterned layer of opaque material over the second layer of light transmissive material;
   selectively etching the second layer of light transmissive material through the patterned layer down to the layer of etch stop material;
   selectively etching the layer of etch stop material through the patterned layer and through the etched second layer of light transmissive material down to the first layer of light transmissive material;
   wherein the first layer of light transmissive material, the layer of etch stop material and the second layer of light transmissive material have thicknesses such that light of the given wavelength directed from a light source through etched portions of the substrate to pattern a photosensitive surface will be shifted in phase by a given amount relative to light of the given wavelength transmitted through unetched portions of the substrate.

9. The method of claim 8, wherein the second layer of light transmissive material is etched with an etch chemistry comprising at least one of fluorine and methane; and the layer of etch stop material is formed to a thickness of less than 10,000 Angstroms.

10. The method of claim 8, wherein the layer of opaque material comprises chrome or molybdenum silicide.

11. The method of claim 1, further comprising selectively etching the layer of etch stop material through the patterned layer and through the etched second layer of light transmissive material down to the first layer of light transmissive material.

12. The method of claim 1, wherein the layer of opaque material comprises at least one of chrome and molybdenum silicide.

13. The method of claim 8, wherein the layer of etch stop material is substantially uniform with regard to its light transmissive properties, and has a thermal coefficient of expansion similar to that of the first and second layers of light transmissive material.

* * * * *